US008339560B2

(12) United States Patent
Tojo et al.

(10) Patent No.: US 8,339,560 B2
(45) Date of Patent: Dec. 25, 2012

(54) METHOD FOR MANUFACTURING DISPLAY DEVICE AND LIQUID CRYSTAL DISPLAY DEVICE

(75) Inventors: Toshio Tojo, Ichinomiya (JP); Nobuyasu Hayashi, Chonan (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 424 days.

(21) Appl. No.: 12/825,576

(22) Filed: Jun. 29, 2010

(65) Prior Publication Data

US 2010/0328595 A1 Dec. 30, 2010

(30) Foreign Application Priority Data

Jun. 29, 2009 (JP) ................................ 2009-154278

(51) Int. Cl.
*G02F 1/1343* (2006.01)

(52) U.S. Cl. ....................................... 349/143; 349/141

(58) Field of Classification Search ........................ None
See application file for complete search history.

(56) References Cited

U.S. PATENT DOCUMENTS 7,106,400 B1 * 9/2006 Tsuda et al. ................. 349/113
2006/0170634 A1 * 8/2006 Kwak et al. ..................... 345/92

FOREIGN PATENT DOCUMENTS

JP 2005-294373 10/2005

* cited by examiner

*Primary Examiner* — Lucy Chien

(74) *Attorney, Agent, or Firm* — Antonelli, Terry, Stout & Kraus, LLP.

(57) ABSTRACT

A method for manufacturing a display device includes the step of forming a preset basic pattern in a plurality of places on an insulation substrate by exposing and developing a photosensitive material film which is formed on the insulation substrate, wherein the exposure is performed using a direct writing exposure device. The exposure is performed using the direct writing exposure device in which the light quantity distribution of the pattern of light formed by the spatial optical modulating element is corrected such that a fluctuation quantity of a size of the basic pattern formed in the plurality of places becomes not more than 0.2 μm.

13 Claims, 13 Drawing Sheets

METHOD FOR MANUFACTURING DISPLAY DEVICE AND LIQUID CRYSTAL DISPLAY DEVICE

CROSS-REFERENCE TO RELATED APPLICATION

The present application claims priority from Japanese application JP2009-154278 filed on Jun. 29, 2009, the content of which is hereby incorporated by reference into this applications.

BACKGROUND OF THE INVENTION

1. Field of the Invention

The present invention relates to a method for manufacturing a display device and a liquid crystal display device, and more particularly to a technique which is effectively applicable to a method for manufacturing a liquid crystal display device.

2. Description of the Related Art

Conventionally, an active-matrix-type liquid crystal display device has been popularly used as a display for a television receiver set or a personal computer, a display for a portable electronic equipment such as a mobile phone and a portable gaming machine, for example.

The active-matrix-type liquid crystal display device is a display device having a liquid crystal display panel in which a liquid crystal material is sealed in a gap defined between a pair of substrates. A display region of the liquid crystal display panel is constituted of amass of pixels each of which has a TFT element, a pixel electrode, a counter electrode and a liquid crystal layer, for example.

When a liquid crystal display device displays a video or an image on a display screen thereof, in each pixel of the liquid crystal display panel, transmissivity of light emitted from a backlight, reflectance of ambient light, or both of these properties are controlled. Here, transmissivity and reflectance of light in each pixel are controlled based on the alignment direction of a liquid crystal layer (liquid crystal molecules) interposed between a TFT substrate and a counter substrate. The alignment direction of the liquid crystal layer is mainly controlled based on the magnitude of potential difference between a pixel electrode and a common electrode or the direction of an electric field which is applied to the liquid crystal layer when such potential difference is generated. Here, a method for arranging pixel electrodes and common electrodes is roughly classified into a method such as a VA method or a TN method in which the pixel electrodes and the common electrodes are arranged with a liquid crystal layer sandwiched therebetween, and a method such as an IPS method in which the pixel electrodes and the common electrodes are arranged on one of a pair of substrates.

In the IPS method, pixel electrodes and common electrodes are formed on the same plane of an insulation layer, for example. Here, the pixel electrode and the common electrode have a planar comb-like shape, and comb-teeth portions of both electrodes are arranged alternately. Further, in the IPS method, the pixel electrode and the common electrode may be stacked by way of an insulation layer, for example. Here, with respect to the pixel electrode and the common electrode, a planar shape of the electrode arranged closer to a liquid crystal layer is formed into a comb-like shape.

In arranging the pixel electrode and the common electrode on the same plane of the insulation layer, it is usually necessary to form these electrodes such that a gap between the comb-teeth portion of the pixel electrode and the comb-teeth portion of the common electrode in each pixel becomes substantially equal. On the other hand, in stacking the pixel electrode and the common electrode, with respect to the electrode arranged closer to the liquid crystal layer, it is necessary to form the electrode such that a gap between the respective comb-teeth portions become substantially equal.

In a step of forming the pixel electrodes and the common electrodes, these electrodes are generally formed by etching a transparent conductive film such as an ITO film. Here, in a conventional method for manufacturing a liquid crystal display panel, a photosensitive material film formed on the transparent conductive film is exposed by an exposure device which uses a photo mask and, thereafter, unnecessary portions of the transparent conductive film are removed using an etching resist obtained by development as a mask.

However, in manufacturing the liquid crystal display panel, usually, the liquid crystal display panel is manufactured using mother glasses having a large area. Accordingly, when the photosensitive material film is exposed by the exposure device using the photo mask, for example, a pattern of light at a portion of the photosensitive material film corresponding to an edge portion of the photo mask is distorted, so that the irregularity in line width of the pixel electrode and the common electrode is liable to become large.

To cope with such a drawback, in a recent method for manufacturing a liquid crystal display panel, there has been proposed a method which, in exposing a photosensitive material film, uses an exposure device referred to as a multi-beam exposure device instead of an exposure device which uses a photo mask.

The multi-beam exposure device is a kind of exposure device of a type referred to as "direct-writing-exposure type" or "direct-exposure type", and forms a pattern of light radiated to a photosensitive material film by performing a numerical control of an MEMS such as a DMD instead of using a photo mask. That is, the direct-writing-exposure-type exposure device can change the pattern of light radiated to the photosensitive material film by correcting numerical data used for the control thus easily reducing irregularity in line width of the pixel electrode and the common electrode, for example.

SUMMARY OF THE INVENTION

In using the direct-writing-exposure-type exposure device such as the multi-beam exposure device, an area which can be exposed at a time is small, that is, approximately several mm×several mm, for example, so that the whole photosensitive material film is exposed by scanning the region which can be exposed at a time. Accordingly, compared to a case where a large area is exposed at a time using a photo mask, the distortion of the pattern of radiated light is small.

However, even when the photosensitive material film is exposed by the direct-writing-exposure-type exposure device, for example, a quantity of light radiated to an area which can be exposed at a time becomes uneven and hence, there exists a possibility that irregularity occurs in line width of pixel electrodes and common electrodes. To cope with this drawback, in the multi-beam exposure device, the irregularity in quantity of light radiated to the photosensitive material film is suppressed by adjusting the distribution of intensity of light radiated to the DMD, that is, the light quantity distribution (intensity distribution) of light radiated from a light source.

Here, the light quantity uniformity of light radiated to the photosensitive material film in the direct-writing-exposure-type exposure device is mainly determined based on the uniformity of a light source, the uniformity of a spatial optical modulating element such as the DMD, and the uniformity of a projection optical system. Here, the irregularity in light quantity attributed to the uniformity of the light source and the uniformity of the projection optical system is gentle and hence, it is thought that the irregularity in light quantity of light radiated to the photosensitive material film can be suppressed simply adjusting the light quantity distribution of light radiated from the light source.

However, the spatial optical modulating element such as the DMD used in the direct-writing-exposure-type exposure device forms a pattern of light by controlling the behavior of several thousands of elements and hence, the mere adjustment of the light quantity distribution of light radiated from the light source cannot suppress the irregularity in light quantity of light radiated to the photosensitive material film because of causes such as irregularity in the reflection direction or a reflection quantity of light in the individual elements.

Accordingly, when the whole photosensitive material film is exposed by scanning an area which can be exposed at a time, for example, the irregularity (fluctuation) having periodicity synchronizing with a size of the area which can be exposed at a time is liable to occur in line width of pixel electrodes and common electrodes. As a result, a manufactured liquid crystal display panel (liquid crystal display device) suffers from a drawback that irregularity in brightness having periodicity synchronizing with a size of the area which can be exposed at a time or the like occurs, for example, thus lowering image quality.

It is an object of the invention to provide a technique which can, for example, reduce the periodic occurrence of unevenness in image quality in a liquid crystal display device.

The above-mentioned and other objects and novel features of the invention will become apparent from the description of this specification and attached drawings.

To explain the summary of typical inventions among the inventions described in this specification, they are as follows.

(1) According to one aspect of the invention, there is provided a method for manufacturing a display device including the step of forming a preset basic pattern in a plurality of places on an insulation substrate by exposing and developing a photosensitive material film which is formed on the insulation substrate, wherein the exposure of the photosensitive material film is performed using a direct writing exposure device in such a manner that an exposure object area is divided into a plurality of small areas, the whole exposure object area is exposed by performing the exposure for every small area, and a pattern of light to be radiated to each small area is formed by performing a numerical control of a spatial optical modulating element, wherein the exposure of the photosensitive material film is performed using the direct writing exposure device in which the light quantity distribution of the pattern of light formed by the spatial optical modulating element is corrected such that a fluctuation quantity of a size of the basic pattern formed in the plurality of places becomes not more than 0.2 μm.

(2) In the method for manufacturing a display device having the above-mentioned constitution (1), the exposure of the photosensitive material film is performed using the direct writing exposure device in which the light quantity distribution of the pattern of light formed by the spatial optical modulating element is corrected such that the fluctuation quantity of a size of the basic pattern formed in the plurality of places becomes not more than 0.1 μm.

(3) In the method for manufacturing a display device having the above-mentioned constitution (1), Fourier analysis is executed on the fluctuation distribution of the size of the basic pattern formed in the plurality of places, and the correction of the light quantity distribution is performed based on the difference between a preset size of the basic pattern and a size of the basic pattern obtained by the Fourier analysis.

(4) In the method for manufacturing a display device having the above-mentioned constitution (3), the photosensitive material film is of a positive type, and the light quantity distribution is corrected such that the light quantity is increased when the size of the basic pattern obtained by the Fourier analysis is larger than the preset size, and the light quantity is reduced when the size of the basic pattern obtained by the Fourier analysis is smaller than the preset size.

(5) In the method for manufacturing a display device having the above-mentioned constitution (1), the basic pattern is formed on a transparent conductive film, and the transparent conductive film is etched using the basic pattern as a mask after the formation of the basic pattern thus forming a first electrode and a second electrode.

(6) In the method for manufacturing a display device having the above-mentioned constitution (5), the first electrode and the second electrode are formed such that the first electrode and the second electrode have a planar comb-like shape respectively, and a comb-teeth portion of the first electrode and a comb-teeth portion of the second electrode are alternately arranged.

(7) In the method for manufacturing a display device having the above-mentioned constitution (5), Fourier analysis is executed on the fluctuation distribution of a size of the first electrode and a size of the second electrode formed in the plurality of places, and the correction of the light quantity distribution is performed based on the difference between preset sizes of the first electrode and the second electrode and sizes of the first electrode and the second electrode obtained by the Fourier analysis.

(8) In the method for manufacturing a display device having the above-mentioned constitution (1), the basic pattern is formed on the transparent conductive film, and the transparent conductive film is etched using the basic pattern as a mask after the formation of the basic pattern thus forming electrodes having a planar comb-like shape.

(9) In the method for manufacturing a display device having the above-mentioned constitution (8), Fourier analysis is executed on the fluctuation distribution of the size of the electrodes formed in the plurality of places, and the correction of the light quantity distribution is performed based on the difference between a preset size of the electrodes and a size of the electrodes obtained by the Fourier analysis.

(10) In the method for manufacturing a display device having the above-mentioned constitution (1), the spatial optical modulating element is constituted of a plurality of ribbon-shaped light diffraction elements, and the plurality of ribbon-shaped light diffraction elements are movable independently from each other, and intensity of diffraction light is changed correspondingly to a moving quantity of each ribbon-shaped light diffraction element.

(11) According to another aspect of the invention, there is provided a liquid crystal display device including: a display area in which pixels having a TFT element, a pixel electrode, a common electrode and a liquid crystal layer are arranged in a matrix array, wherein the plurality of pixel electrodes which are arranged in the display area in a matrix array are formed such that, with respect to a size of the pixel electrode in a direction as viewed in a plan view, the difference between the size of the pixel electrode which assumes a maximum value and the size of the pixel electrode which assumes a minimum value is set to not more than 0.2 μm.

(12) In the liquid crystal display device having the constitution (11), the plurality of pixel electrodes are formed such that, with respect to the size of the pixel electrode in the direction as viewed in a plan view, the difference between the size of the pixel electrode which assumes the maximum value and the size of the pixel electrode which assumes the minimum value is set to not more than 0.1 μm.

(13) In the liquid crystal display device having the constitution (11), the pixel electrode has a comb-like shape including a plurality of strip-shaped portions as viewed in a plan view, and the difference between a maximum value and a minimum value of a width of the strip-shaped portion and the difference between a maximum value and a minimum value of a gap defined between two neighboring strip-shaped portions are set to not more than 0.2 μm.

According to the method for manufacturing a display device and the liquid crystal display device according to the invention, it is possible to reduce the occurrence of the periodic unevenness in image quality in a liquid crystal display device, for example.

DETAILED DESCRIPTION OF THE INVENTION

Hereinafter, the invention is explained in detail in conjunction with embodiments by reference to the drawings. Here, in all drawings for explaining the embodiments, parts having identical functions are given same numerals and their repeated explanation is omitted.

FIG. 1 to FIG. 4 are schematic views for explaining one example of the schematic constitution of a liquid crystal display panel to which the invention is preferably applicable.

Figure 1:
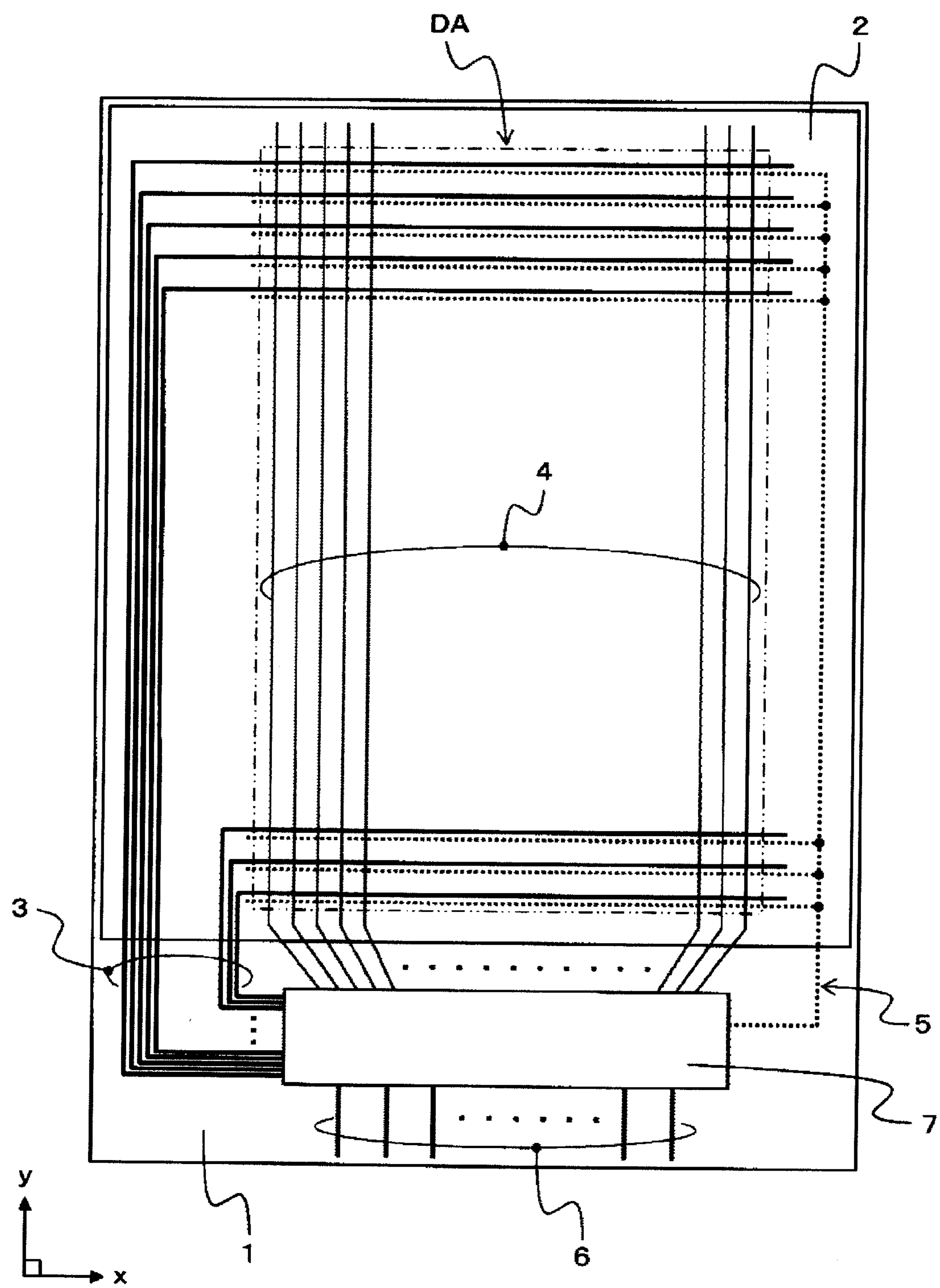
FIG. 1 is a schematic plan view showing one example of the schematic constitution of a liquid crystal display panel to which the invention is preferably applicable.
Figure 2:
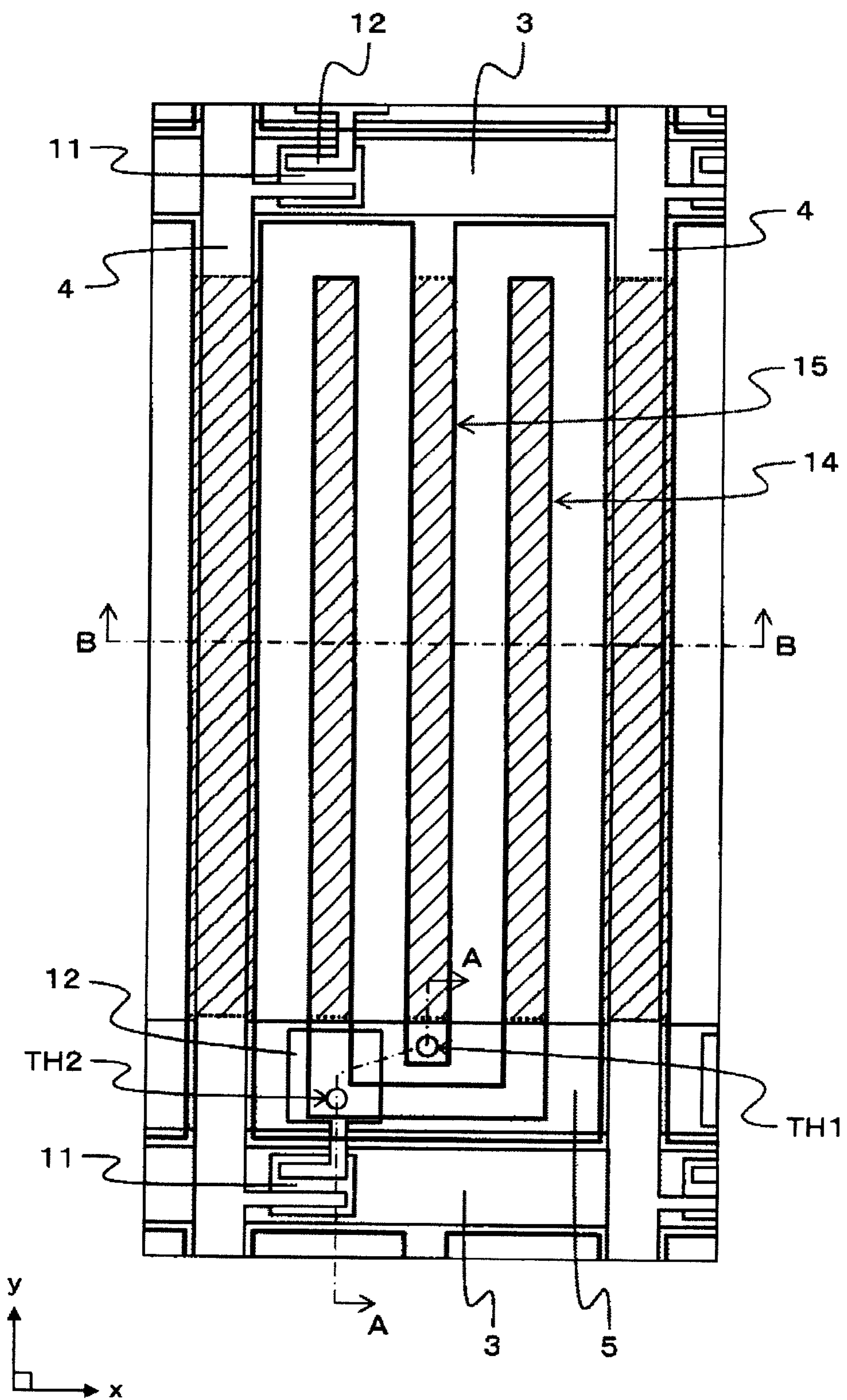
FIG. 2 is a schematic plan view showing one example of the planar constitution of a pixel formed on a TFT substrate of the liquid crystal display panel shown in FIG. 1.
Figure 3:
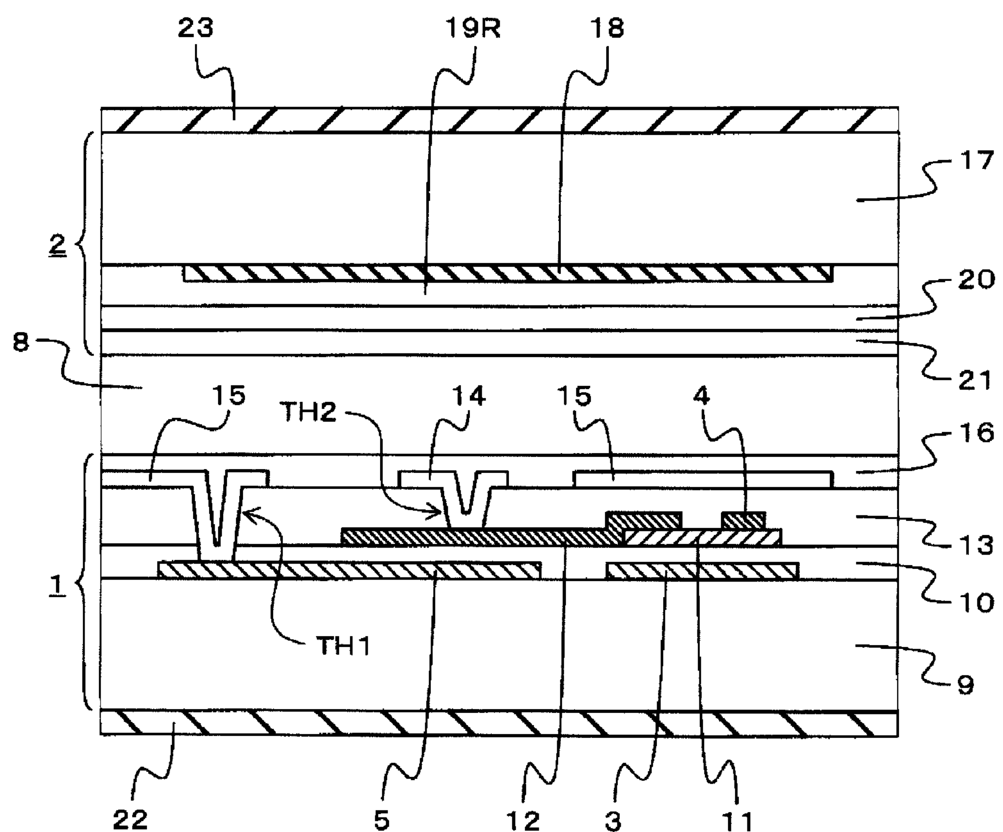
FIG. 3 is a schematic cross-sectional view showing one example of the cross-sectional constitution of the liquid crystal display panel taken along a line A-A in FIG. 2.
Figure 4:
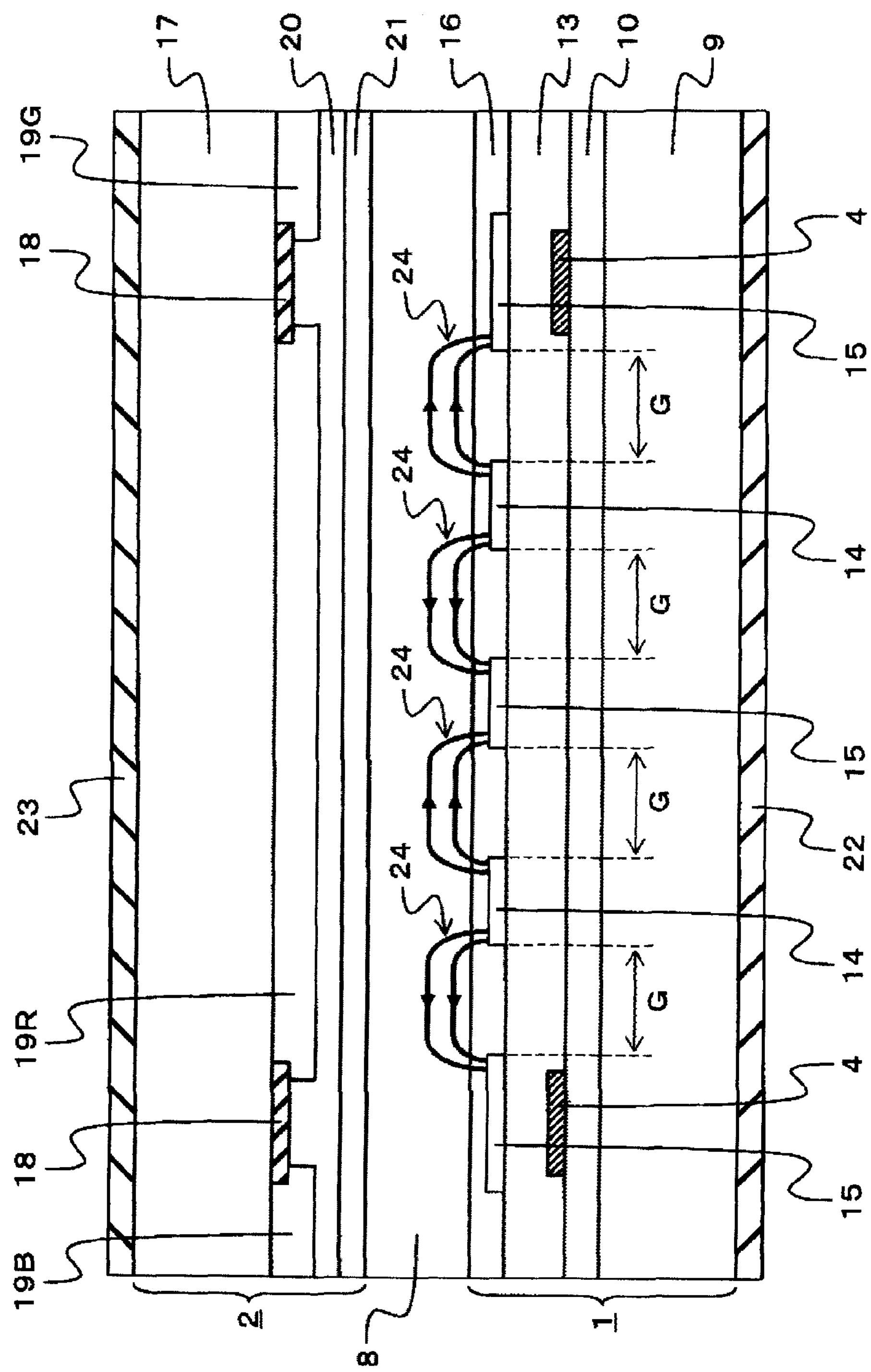
FIG. 4 is a schematic cross-sectional view showing one example of the cross-sectional constitution of the liquid crystal display panel taken along a line B-B in FIG. 2.

FIG. 1 is a schematic plan view showing one example of the schematic constitution of a liquid crystal display panel to which the invention is preferably applicable. FIG. 2 is a schematic plan view showing one example of the planar constitution of a pixel formed on a TFT substrate of the liquid crystal display panel shown in FIG. 1. FIG. 3 is a schematic cross-sectional view showing one example of the cross-sectional constitution of the liquid crystal display panel taken along a line A-A in FIG. 2. FIG. 4 is a schematic cross-sectional view showing one example of the cross-sectional constitution of the liquid crystal display panel taken along a line B-B in FIG. 2.

In this embodiment, as one example of a liquid crystal display panel to which the invention is preferably applicable, an IPS-method active-matrix-type liquid crystal display panel which is used in a liquid crystal display of portable electronic equipment such as a mobile phone is named.

An active-matrix-type liquid crystal display panel which is used in mobile phone or the like includes, for example, a TFT substrate 1 and a counter substrate 2 as shown in FIG. 1, and a liquid crystal material (not shown in the drawing) is interposed between the TFT substrate 1 and the counter substrate 2. Here, the TFT substrate 1 and the counter substrate 2 are adhered to each other by an annular sealing material (not shown in the drawing) which surrounds a display area DA, and the liquid crystal material is sealed in a space surrounded by the TFT substrate 1, the counter substrate 2 and the sealing material.

The TFT substrate 1 includes a plurality of scanning signal lines 3, a plurality of video signal lines 4, common lines 5, signal input lines 6, and TFT elements, pixel electrodes and common electrodes not shown in the drawing. Further, the TFT substrate 1 has a larger planar size than the counter substrate 2, and on a portion of the TFT substrate 1 which projects from the counter substrate 2 without overlapping with the counter substrate 2, an IC chip 7 having a drive circuit for operating the liquid crystal display panel and the like is mounted, for example.

The plurality of scanning signal lines 3 respectively have portions which pass the display area DA and each have one end thereof connected to the IC chip 7. Here, the portions of the respective scanning signal lines 3 which pass the display area DA extend in the x direction and are arranged parallel to each other in the y direction at predetermined intervals.

The plurality of video signal lines 4 respectively have portions which pass the display area DA and each have one end thereof connected to the IC chip 7. Here, the portions of the respective video signal lines 4 which pass the display area DA extend in the y direction and are arranged parallel to each other in the x direction at predetermined intervals. Further, an insulation layer is interposed in a region where the scanning signal line 3 and the video signal line 4 intersect with each other.

The display area DA of the active-matrix-type liquid crystal display panel is an area where a plurality of pixels are arranged in a matrix array, and an area which one pixel occupies corresponds to an area surrounded by two neighboring scanning signal lines 3 and two neighboring video signal lines 4, for example. Here, each pixel includes, for example, a TFT element which functions as an active element (also referred to as "switching element"), a pixel electrode and a common electrode.

Further, in the IPS-method active-matrix-type liquid crystal display panel, the TFT elements, the pixel electrodes and the common electrodes are formed on the TFT substrate 1. Here, one pixel of the liquid crystal display panel has the constitution shown in FIG. 2 to FIG. 4, for example.

The TFT substrate 1 includes a first insulation substrate 9 formed of a glass substrate or the like, and the scanning signal lines 3, the common lines 5, and a first insulation layer 10 which covers the first insulation substrate 9, the scanning signal lines 3 and the common lines 5 are formed on a surface (a surface facing the liquid crystal layer 8 in an opposed manner) of the first insulation substrate 9.

On the first insulation layer 10, semiconductor layers 11 of the TFT elements, the video signal lines 4, source electrodes 12 of the TFT elements, and a second insulation layer 13 which covers the first insulation layer 10, the semiconductor layers 11, the video signal lines 4 and the source electrodes 12 are formed. Here, the semiconductor layer 11 is arranged above the scanning signal line 3, and allows the scanning signal line 3 to function as a gate electrode of the TFT element and allows the first insulation layer 10 to function as agate insulation film of the TFT element. Further, the video signal line 4 has a portion which straddles the semiconductor layer 11, and allows the portion to function as a drain electrode of the TFT element. Further, the source electrode 12 has a portion thereof overlapped with the common line 5 thus being used as an electrode for forming a holding capacitance.

On the second insulation layer 13, a pixel electrode 14, a common electrode 15 and a first alignment film 16 which covers the second insulation layer 13, the pixel electrode 14 and the common electrode 15 are formed.

The common electrode 15 is an electrode which is used in common by the plurality of pixels and includes opening portions corresponding to the respective pixels. Further, the common electrode 15 includes a branched portion which extends in the y direction at a center portion of each opening portion as viewed in the x direction. Here, a distal end of the branched portion of the common electrode 15 is connected with the common line 5 via a first through hole TH1. Then, the common electrode 15 is also connected with the common line 5 via another through hole formed outside the display area DA, for example.

The pixel electrode 14 is an electrode which is provided for every pixel independently, and is constituted of two comb-teeth portions which are arranged parallel to each other with the branched portion of the common electrode 15 sandwiched therebetween and extend in the y direction and a portion which connects the two comb-teeth portions to each other. Here, the pixel electrode 14 is connected to the source electrode 12 via a second through hole TH2.

On the other hand, the counter substrate 2 includes a second insulation substrate 17 formed of a glass substrate or the like. On a surface (a surface facing the liquid crystal layer 8 in an opposed manner) of the second insulation substrate 17, a black matrix 18, color filters 19R, 19G and 19B, and a leveling film 20 which covers the black matrix 18 and the respective color filters 19R, 19G, 19B are formed. When the liquid crystal display panel is compatible with an RGB-type color display, on the surface of the second insulation substrate 17, three kinds of color filters consisting of red filters 19R through which light passes to exhibit red, green filters 19G through which light passes to exhibit green, and blue filters 19B through which light passes to exhibit blue. Each pixel usually includes any one of three kinds of color filters. Here, the red filters 19R, the green filters 19G and the blue filters 19B are arranged, for example, such that three pixels which are continuously arranged in the x direction are constituted of the pixel having the red filter 19R, the pixel having the green filter 19G and the pixel having the blue filter 19B.

A second alignment film 21 is formed on the leveling film 20. A columnar spacer may also be formed on the leveling film 20 for making a thickness of the liquid crystal layer 8 in each pixel uniform, for example.

Further, when the liquid crystal display device is of a transmission type or a transflective type, usually, a first polarizer 22 is mounted on a surface of the first insulation substrate 9 on a side opposite to a surface facing the liquid crystal layer 8, and a second polarizer 23 is mounted on a surface of the second insulation substrate 17 on a side opposite to a surface facing the liquid crystal layer 8. Here, the first polarizer 22 and the second polarizer 23 are arranged such that absorption axes of the respective polarizers orthogonally intersect with each other.

When a liquid crystal display device displays a video or an image on a display screen thereof, in each pixel of the liquid crystal display panel, transmissivity of light emitted from a backlight, reflectance of ambient light, or both of these properties are controlled. Here, transmissivity and reflectance of light in each pixel are controlled based on the alignment direction of the liquid crystal layer 8 (liquid crystal molecules) interposed between the TFT substrate 1 and the counter substrate 2. The alignment direction of the liquid crystal layer 8 is mainly controlled based on the magnitude of potential difference between the pixel electrode 14 and the common electrode 15 or the direction of an electric field which is applied to the liquid crystal layer 8 when such potential difference is generated.

In the pixel having the constitution shown in FIG. 2 to FIG. 4, the alignment direction of the liquid crystal layer 8 when the pixel electrode 14 and the common electrode 15 have the same potential (that is, potential difference being 0) follows the alignment direction of the first alignment film 16 and the second alignment film 21. In case of the IPS-type liquid crystal display panel, the liquid crystal layer 8 adopts the homogeneous alignment where the alignment direction of the liquid crystal layer 8 when the pixel electrode 14 and the common electrode 15 have the same potential becomes substantially parallel to either one of an absorption axis of the first polarizer 22 and an absorption axis of the second polarizer 23. Here, the pixel in which the pixel electrode 14 and the common electrode 15 have the same potential performs a dark display.

Further, in the pixel having the constitution shown in FIG. 2 to FIG. 4, when the potential difference is applied between the pixel electrode 14 and the common electrode 15, lines of electric force 24 which pass through the liquid crystal layer 8 as shown in FIG. 4 are generated, and an electric field which is referred to as "fringe electric field" is applied to the liquid crystal layer 8. Here, the alignment direction of the liquid crystal layer 8 is rotated correspondingly to the magnitude and direction of the electric field applied to the liquid crystal layer 8. Accordingly, the pixel in which the potential difference is applied between the pixel electrode 14 and the common electrode 15 performs a bright display corresponding to the magnitude of the potential difference.

In case of a liquid crystal display device which is compatible with an RGB-method color display, 1 dot (picture element) of a video or an image is constituted of three pixels consisting of the pixel having the red filter 19R, the pixel having the green filter 19G and the pixel having the blue filter 19B, for example, and colors of respective dots are controlled based on the combination of brightness of three pixels (potentials of the pixel electrode 14).

The intensity of the electric field which is applied to the liquid crystal layer 8 when the predetermined potential difference is applied between the pixel electrode 14 and the common electrode 15 is changed based on a size of a gap G defined between the pixel electrode 14 and the common electrode 15. With respect to the pixel electrode 14 and the common electrode 15 of the pixel shown in FIG. 2 to FIG. 4, portions of the pixel electrode 14 and the common electrode 15 which largely contribute to the control of the alignment direction of the liquid crystal molecules, in other words, portions of the pixel electrode 14 and the common electrode 15 which largely contribute to the control of the transmissivity and the reflectance of light are the portions of the pixel electrode 14 and the common electrode 15 which extend along the extending direction (y direction) of the video signal line 4 (portions to which a group of parallel oblique lines are added in FIG. 2). Accordingly, in forming the pixel electrode 14 and the common electrode 15 having a planar shape as shown in FIG. 2 to FIG. 4, the pixel electrode 14 and the common electrode 15 are formed such that a gap between the pixel electrode 14 and the common electrode 15 at the portions which largely contribute to the control of the alignment direction of the liquid crystal molecules (portions to which a group of parallel oblique lines are added in FIG. 2) assumes an approximately fixed value G.

In manufacturing the TFT substrate 1 having the constitution shown in FIG. 2 to FIG. 4, the pixel electrodes 14 and the common electrodes 15 are usually formed by etching a transparent conductive film such as an ITO film. Here, a protective film (etching resist) which is formed on the transparent conductive film is usually formed by exposing and developing a photosensitive material film formed on the transparent conductive film. Further, in the conventional method for manufacturing the TFT substrate 1, the exposure of the photosensitive material film is, in general, performed by an exposure device which uses a photo mask.

However, when the photosensitive material film is exposed by the exposure device which uses the photo mask, light which passes through the photo mask forms an image on a surface of the photosensitive material film using a plurality of lenses and hence, for example, distortion is liable to be generated on a pattern of light which is radiated to the photosensitive material film. Accordingly, when the exposure of the photosensitive material film is performed by the exposure device which uses a photo mask in the step of forming the pixel electrode 14 and the common electrode 15, for example, irregularity is liable to occur in the size of the gap G defined between the pixel electrode 14 and the common electrode 15 in each pixel within one TFT substrate 1. Further, when the liquid crystal display panel is manufactured by a method referred to as a multi-piece simultaneous manufacturing method, for example, irregularity is liable to occur in the size of the gap G defined between the pixel electrode 14 and the common electrode 15 among the plurality of liquid crystal display panels which are obtained from one set of mother glasses. When irregularity occurs in the size of the gap G defined between the pixel electrode 14 and the common electrode 15 in this manner, irregularity occurs in the intensity of an electric field which is applied to the liquid crystal layer 8 when the predetermined potential difference is applied between both electrodes and hence, irregularity occurs in an image quality of the liquid crystal display device.

Further, in performing the exposure of the photosensitive material film in the step of forming the pixel electrode 14 and the common electrode 15 by the exposure device which uses the photo mask, for example, when irregularity which cannot be ignored occurs in the size of the gap G defined between the pixel electrode 14 and the common electrode 15, it is necessary to prepare a new photo mask by correcting sizes and forming positions of both electrodes.

Figure 5:
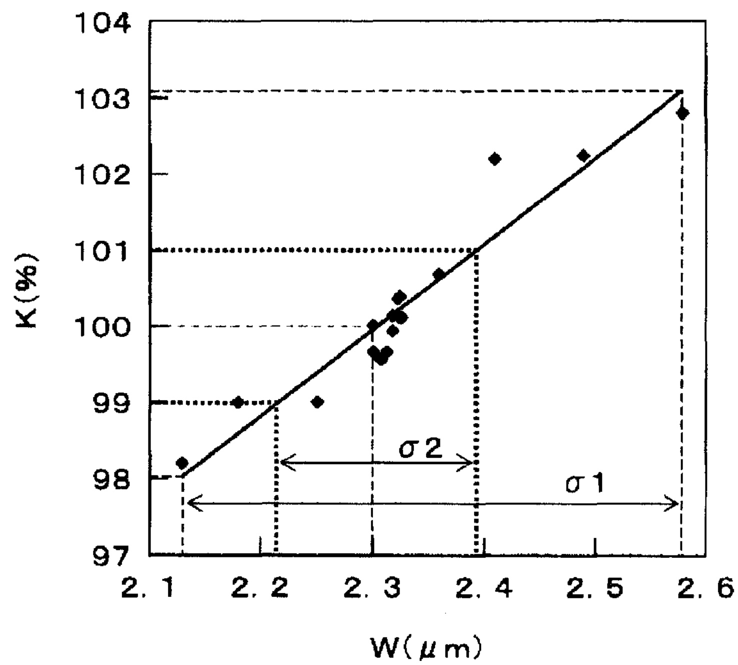
FIG. 5 is a schematic graph showing one example of the relationship between the distribution of line width of pixel electrodes and common electrodes and the brightness of pixels obtained when a photosensitive material film is exposed by an exposure device which uses a photo mask.

FIG. 5 is a schematic graph showing one example of the relationship between the distribution of line width of the pixel electrode and the common electrode obtained when the photosensitive material film is exposed by the exposure device which uses the photo mask and the brightness of the pixels.

In manufacturing the liquid crystal display panel having the constitution shown in FIG. 2 to FIG. 4, when the photosensitive material film is exposed by the exposure device which uses the photo mask in the step of forming the pixel electrode 14 and the common electrode 15, the relationship between the line width of the pixel electrode and the common electrode and the brightness of the pixels in one liquid crystal display panel assumes the relationship shown in FIG. 5, for example. FIG. 5 also shows one example of the relationship between the line width W and the relative brightness QoE obtained when the pixel electrode 14 and the common electrode 15 are formed such that the portions of the pixel electrode 14 and the common electrode 15 which largely contribute to the control of the alignment direction of liquid crystal molecules (a strip portion with a group of parallel oblique lines in FIG. 2) have the line width W of 2.3 μm and the brightness under a predetermined operating condition with the white intermediate brightness at which the irregularity in brightness is observed most easily is measured.

In this manner, when the photosensitive material film is exposed by the exposure device which uses the photo mask, a fluctuation quantity al of the line width W of the pixel electrode 14 and the common electrode 15 obtained by such exposure becomes large, that is, not less than 0.4 μm, and a fluctuation quantity of the relative brightness QoE becomes approximately 5%. Accordingly, the liquid crystal display panel manufactured by the method suffers from the unevenness in image quality due to such fluctuation of brightness.

Here, in the liquid crystal display panel used in general, when the fluctuation quantity of the relative brightness QoE is not more than 2%, for example, it is difficult to recognize the fluctuation as unevenness in image quality. Further, the relationship between the fluctuation quantity of the line width W of the pixel electrode 14 and the common electrode 15 and the fluctuation quantity of the relative brightness QoE assumes the approximately proportional relationship as shown in FIG. 5. Accordingly, to reduce the irregularity in brightness attributed to the irregularity in line width W of the pixel electrode 14 and the common electrode 15, for example, it is sufficient to suppress the fluctuation quantity of the line width W of the pixel electrode 14 and the common electrode 15 to not more than σ2 (not more than 0.2 μm). It is further desirable to suppress the fluctuation quantity of the line width W of the pixel electrode 14 and the common electrode 15 to not more than 0.1 μm.

However, the liquid crystal display panel is manufactured using mother glasses having a large area such as 730 mm×920 mm, for example. Accordingly, when the photosensitive material film is exposed by the exposure device which uses the photo mask, it is difficult to suppress the fluctuation quantity of the line width W of the pixel electrode 14 and the common electrode 15 to not more than 0.2 μm.

In view of the above, with respect to a method for manufacturing a liquid crystal display panel, the application of a method for exposing the photosensitive material film by an exposure device which does not use a photo mask which is referred to as "direct writing exposure method" or "direct exposure method" has been studied recently.

The direct-writing-exposure-type exposure device is an exposure device which uses, instead of a photo mask, for example, a spatial optical modulating element which forms a pattern of light to be radiated to a photosensitive material film by a numerical control based on layout data prepared by a CAD or the like. For example, as the spatial optical modulating element, MEMS (Micro Electro Mechanical Systems) such as a DMD (Digital Micromirror Device) and a GLV (Grating Light Valve) are used.

The DMD includes a plurality of micromirrors, and each micromirror is configured to change the direction thereof (light reflecting direction) by an electrostatic force, for example. Accordingly, the exposure device which uses the DMD as the spatial optical modulating element can form a pattern of light to be radiated to the photosensitive material film by controlling the direction of each micromirror based on the layout data.

On the other hand, the GLV includes a plurality of ribbon-shaped light diffraction elements. The respective ribbon-shaped light diffraction elements can be moved in response to an electric signal, for example, and the ribbon-shaped light diffraction element can change light quantity of diffraction light based on a moving quantity. Accordingly, the exposure device which uses the GLV as the spatial optical modulating element can form a pattern of light to be radiated to the photosensitive material film by controlling moving quantity of each ribbon-shaped light diffraction element based on layout data.

Figure 6:
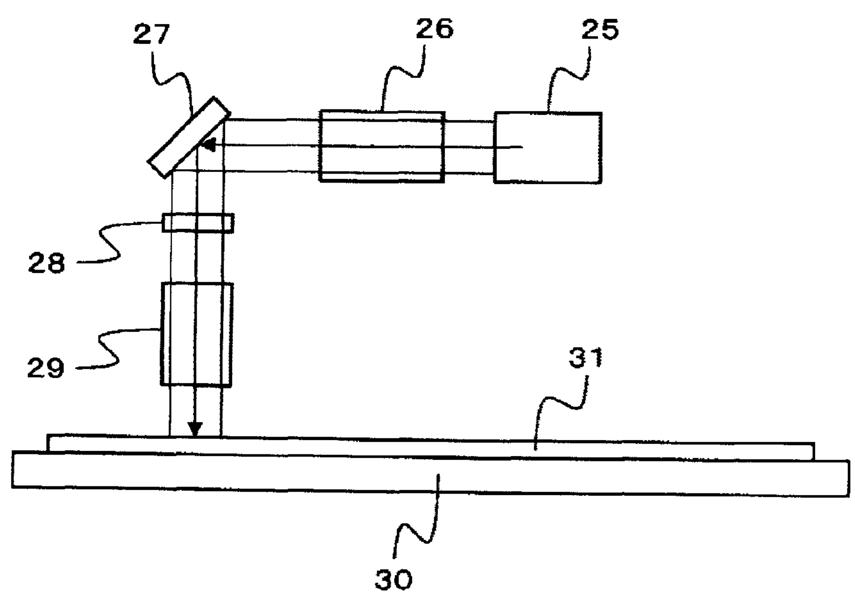
FIG. 6 is a schematic view showing one example of the schematic constitution of a direct-writing-exposure-type exposure device.
Figure 7:
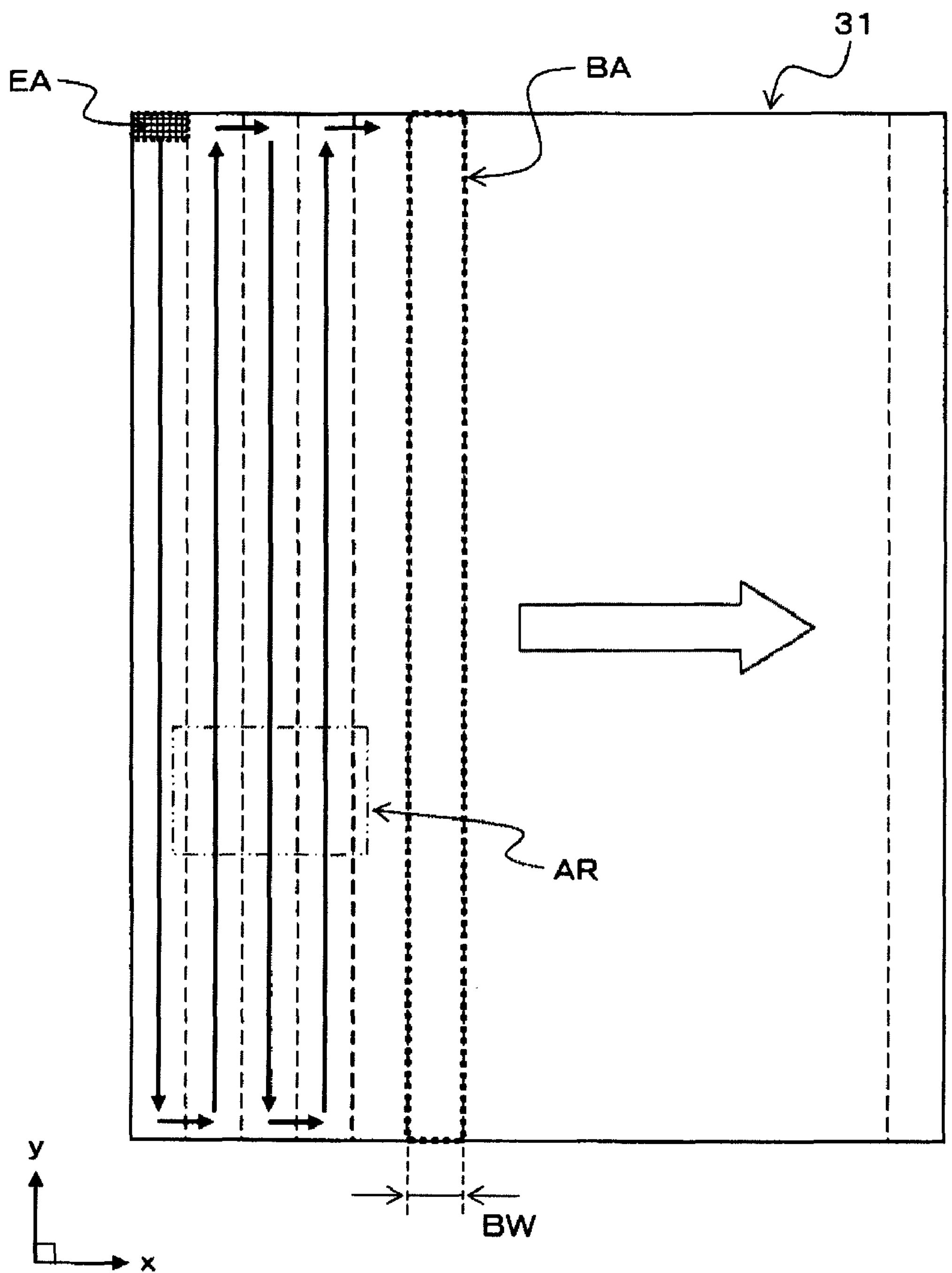
FIG. 7 is a schematic view showing one example of an exposure method of a photosensitive material film which uses a direct-writing-exposure-type exposure device.
Figure 8:
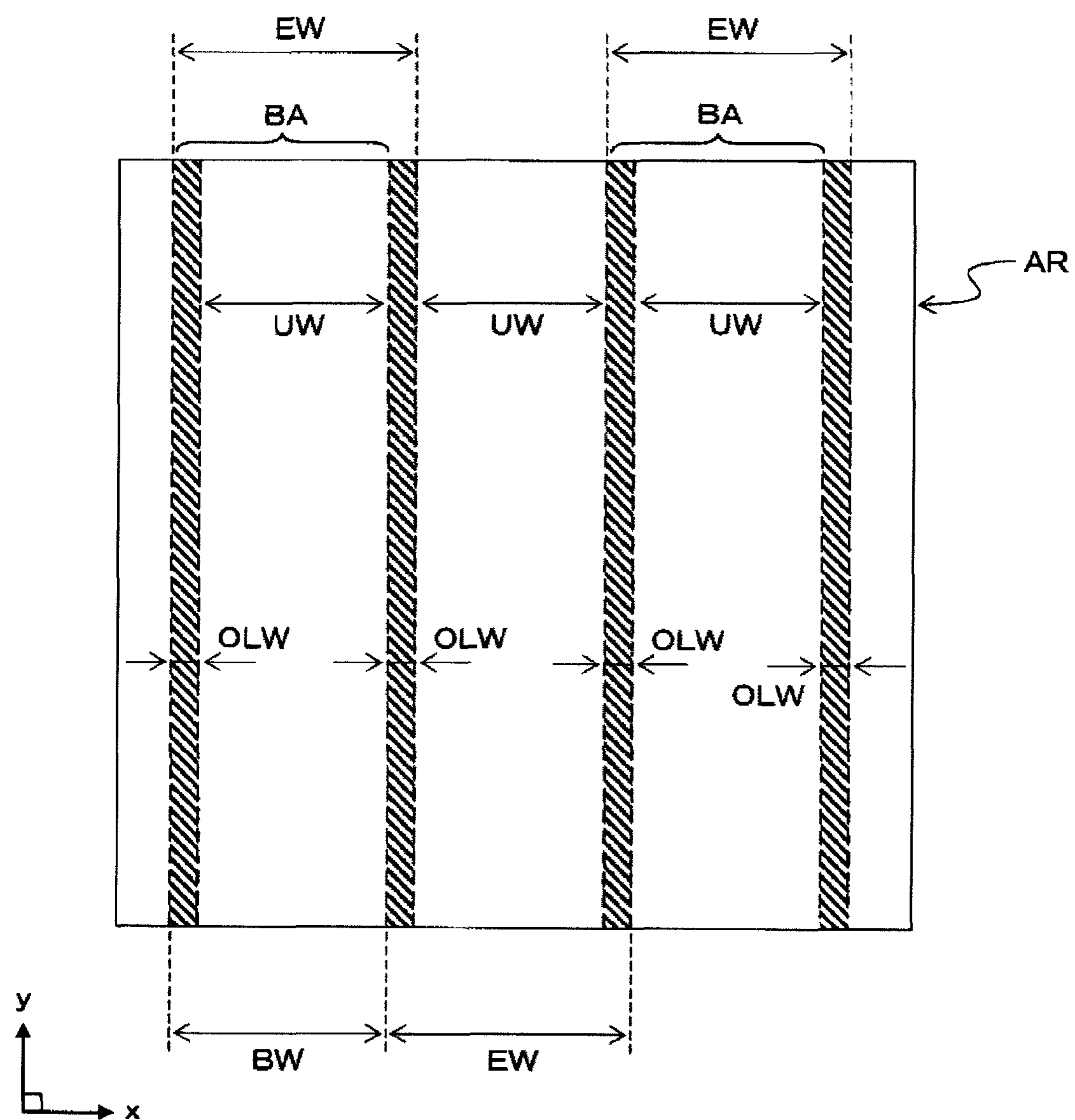
FIG. 8 is a schematic view showing an area AR in FIG. 7 in an enlarged manner.
Figure 9:
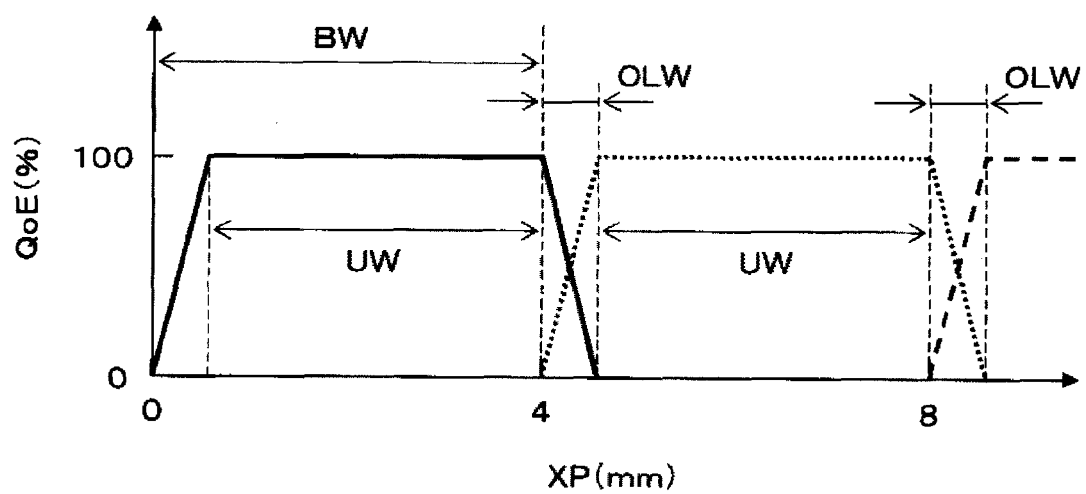
FIG. 9 is a schematic graph showing one example of the distribution of exposure light quantity.

FIG. 6 to FIG. 9 are schematic views for explaining one example of the schematic constitution of the direct-writing-exposure-type exposure device and one example of the exposure method. FIG. 6 is a schematic view showing one example of the schematic constitution of the direct-writing-exposure-type exposure device. FIG. 7 is a schematic view showing one example of the exposure method of a photosensitive material film using the direct-writing-exposure-type exposure device. FIG. 8 is a schematic view showing an area AR shown in FIG. 7 in an enlarged manner. FIG. 9 is a schematic graph showing one example of the distribution of exposure light quantity.

The direct-writing-exposure-type exposure device which uses the GLV as the spatial optical modulating element includes, for example, as shown in FIG. 6, a light source 25, an illumination optical system 26, a spatial optical modulating element 27 (GLV), a diffraction light filter 28, a projection optical system 29, and a stage 30.

The light source 25 is, for example, a laser light source which emits a laser beam of a wavelength which can expose the photosensitive material film, wherein the laser beam which the light source 25 emits passes through the illumination optical system 26 and is incident on the spatial optical modulating element 27. Here, the spatial optical modulating element 27, for example, moves the respective ribbon-shaped light diffraction elements based on layout data (numerical value data) prepared by a CAD or the like, and generates diffraction light of a pattern which reflects the layout data. Here, light which is radiated from the spatial optical modulating element 27 and advances toward a base plate 31 fixed on the stage 30 contains, besides the above-mentioned diffraction light, reflection light which is reflected on the spatial optical modulating element 27. In the direct-writing-exposure-type exposure device, light necessary for exposing the photosensitive material film formed on the base plate 31 is only the diffraction light and the reflection light is unnecessary. Accordingly, in the direct-writing-exposure-type exposure device which uses the GLV as the spatial optical modulating element 27, the diffraction light filter 28 is arranged between the spatial optical modulating element 27 and the base plate 31 so as to eliminate the reflection light contained in the light which is radiated from the spatial optical modulating element 27 and advances toward the base plate 31. The diffraction light which passes through the diffraction light filter 28 is projected on the base plate 31 with a reduced size at a reduction ratio of 1/10 by the projection optical system 29, for example.

In the GLV which is used as the spatial optical modulating element 27, the minute ribbon-shaped light diffraction elements are arranged in row, so that a pattern of the formed diffraction light, in other words, an area which can be exposed at a time is one-dimensional.

Accordingly, when the photosensitive material film is exposed by the direct-writing-exposure-type exposure device which uses the GLV as the spatial optical modulating element 27, an optical unit constituted of, for example, the light source 25, the illumination optical system 26, the spatial optical modulating element 27 (GLV), the diffraction light filter 28 and the projection optical system 29 is fixed, and the stage 30 is moved. Accordingly, the whole photosensitive material film can be exposed by displacing a position of an area on the base plate 31 which can be exposed at a time.

Here, the exposure of the photosensitive material film formed on the base plate 31 is performed such that, as shown in FIG. 7, for example, the whole photosensitive material film is divided into a plurality of strip-shaped areas BA having the longitudinal direction thereof set in the y direction, and main scanning which moves an area EA which can be exposed at a time in the y direction and sub scanning which moves the area EA in the x direction are repeatedly performed. Here, a width BW of the strip-shaped area BA is approximately 1 mm to 10 mm, for example.

Further, when the photosensitive material film is divided into the plurality of strip-shaped areas BA as shown in FIG. 7 and the exposure is performed by repeating the main scanning and the sub scanning, to prevent the formation of an unexposed area in a boundary between two neighboring strip-shaped areas BA, for example, as shown in FIG. 8, it is desirable to form a superposing area having a width (size in the short-side direction) OLW in a boundary portion between two neighboring strip-shaped areas BA. Here, it is desirable to set the width OLW of the superposing area as small as possible, although it is arbitrary. Further, in forming the superposing area, the spatial optical modulating element in which the width EW of the area EA which can be exposed at a time (exposure width in main scanning at a time) satisfies a condition EW=BA+OLW, for example, shown in FIG. 8 is used. Here, although the width OLW of the superposing area is shown in an enlarged manner in FIG. 8 for facilitating the understanding of the drawing, an actual width OLW is approximately several ten μm.

The superposing area formed in the boundary between two neighboring strip-shaped areas BA is exposed twice at the time of exposing the strip-shaped area BA on a left side of the superposing area and at the time of exposing the strip-shaped area BA on a right side of the superposing area. Accordingly, in forming the superposing area having the width OLW, it is desirable that the distribution of the light quantity QoE in the width direction (x direction) in main scanning at a time is set to the distribution shown in FIG. 9, for example, so that the total quantity consisting of light quantity at the time of performing the first-time exposure of the superposing area and light quantity at the time of performing the second-time exposure of the superposing area becomes substantially equal to the light quantity QoE of light radiated to the strip-shaped area having the width UW exposed only one time.

Figure 10:
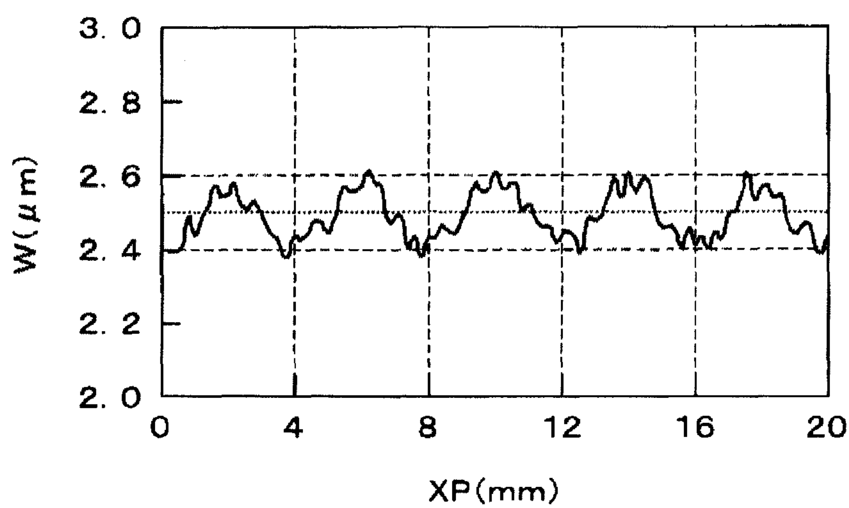
FIG. 10 is a schematic graph showing one example of the relationship between an exposure position in the x direction and a line width of the pixel electrode and the common electrode obtained when a photosensitive material film is exposed by a conventional exposure method which uses a direct-writing-exposure-type exposure device.

FIG. 10 is a schematic graph showing one example of the relationship between a position in the x direction obtained when the photosensitive material film is exposed by a conventional exposure method using the direct-writing-exposure-type exposure device and a line width of the pixel electrode and the common electrode. FIG. 10 shows one example of the relationship between a position in the x direction obtained when the width BW of the strip-shaped area BA is set to 4 mm and the line width of the pixel electrode and the common electrode.

In exposing the photosensitive material film using the direct-writing-exposure-type exposure device, conventionally, for example, as shown in FIG. 9, calibration is performed so as to make the distribution of light quantity in the strip-shaped area having the width UW exposed only one time uniform. Accordingly, in exposing the photosensitive material film using the direct-writing-exposure-type exposure device, the line widths of the pixel electrodes 14 and the common electrodes 15 in the respective pixels arranged in the x direction should originally have the substantially fixed value.

However, even when the light quantity distribution is adjusted to assume the distribution shown in FIG. 9, for example, as shown in FIG. 10, the line widths W of the pixel electrodes 14 and the common electrodes 15 in the respective pixels arranged in the x direction are fluctuated. Here, FIG. 10 shows one example of the distribution of the actual line width W when the pixel electrodes 14 and the common electrodes 15 are formed such that the line width of the pixel electrode 14 and the common electrode 15 becomes 2.5 μm. Here, the fluctuation quantity of the line width W is approximately 0.2 μm, which is smaller than a fluctuation width σ1 obtained when the exposure device using a photo mask shown in FIG. 5 is used. Accordingly, the irregularity in brightness attributed to the irregularity in the line width W of the pixel electrode 14 and the common electrode 15 is reduced.

However, to observe the distribution of the line width W of the pixel electrode 14 and the common electrode 15 shown in FIG. 10 in perspective, the line width W is fluctuated at a cycle (4 mm cycle) synchronizing with the exposure width EW in main scanning at a time. Accordingly, in a liquid crystal display device having such distribution of line width W, the irregularity in brightness having periodicity corresponding to the exposure width EW in main scanning at a time occurs.

Figure 11:
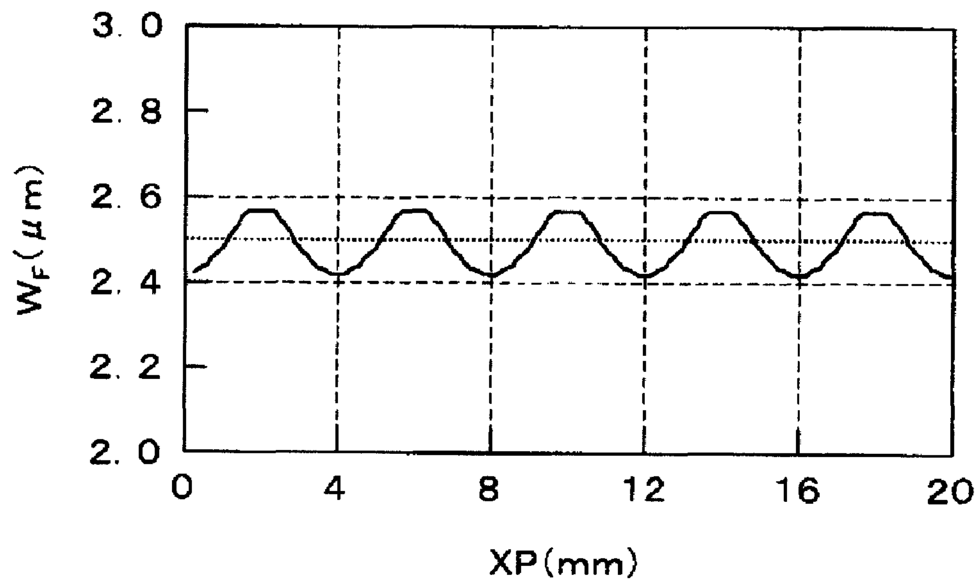
FIG. 11 is a schematic graph showing one example of a result obtained by removing noise components in the distribution of line width shown in FIG. 10.
Figure 12:
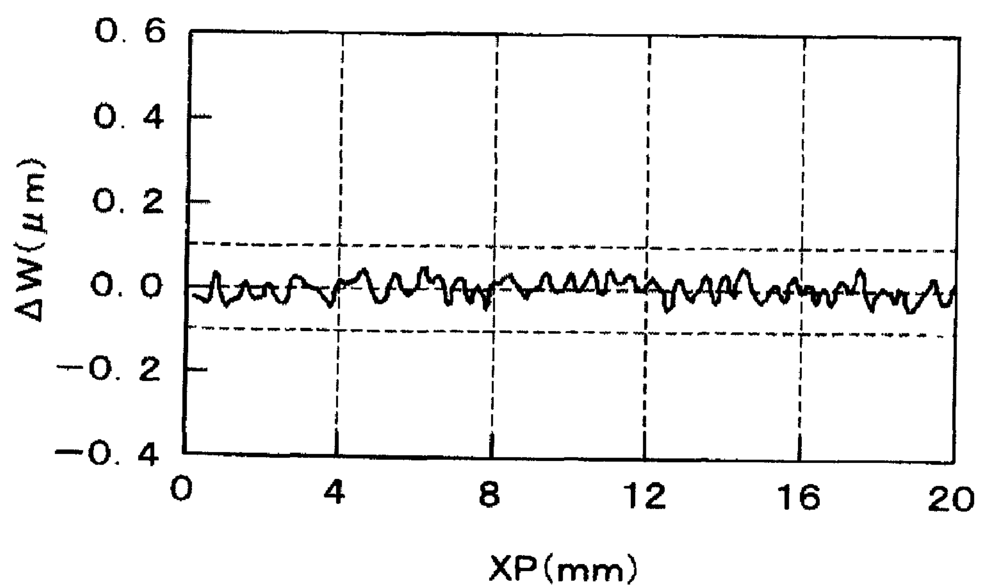
FIG. 12 is a schematic graph showing noise components in the distribution of line width shown in FIG. 10.
Figure 13:
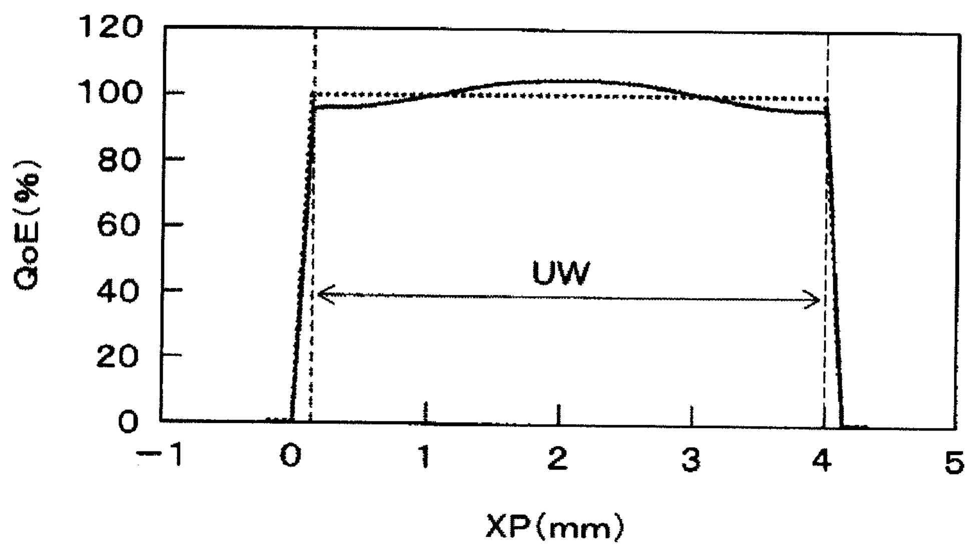
FIG. 13 is a schematic graph showing one example of a light quantity correcting method.

FIG. 11 to FIG. 13 are schematic views for explaining the principle of the method for manufacturing a liquid crystal display device according to this embodiment. FIG. 11 is a schematic graph showing one example of a result obtained by removing noise components in the distribution of line width shown in FIG. 10. FIG. 12 is a schematic graph showing the noise components in the distribution of line width shown in FIG. 10. FIG. 13 is a schematic graph showing one example of a light quantity correction method.

When inventors of the invention have eliminated noise components by executing Fourier analysis of the distribution shown in FIG. 10, for example, as shown in FIG. 11, waves having a cycle (4 mm cycle) synchronizing with the width BW of the strip-shaped area BA were confirmed. The fluctuation of the waves was approximately 0.18 μm. Here, the eliminated noise components ΔW exhibited the distribution shown in FIG. 12, for example, and a fluctuation quantity of the noise components was approximately 0.1 μm.

Factors which cause irregularity in line width when the pixel electrodes and the common electrodes are formed by etching the transparent conductive film are classified into process factors in the exposure step, the development step and the etching step, and factors attributed to the measurement accuracy (measurement error) at the time of measuring the line widths.

Further, it is thought that the fluctuation of the line width W having periodicity shown in FIG. 11 which takes place when the photosensitive material film is exposed by repeating main scanning and sub scanning is mainly attributed to the distribution of exposure light quantity at the time of exposure. Further, it is thought that the noise components ΔW shown in FIG. 12 are mainly attributed to process factors in the development step and the etching step, and the measurement accuracy (measurement error) at the time of measuring the line widths.

Further, in the step of forming the pixel electrodes 14 and the common electrodes 15, for example, when an etching resist is formed by exposing a positive photosensitive material film, the line width W becomes large at portions where light quantity is insufficient, and the line width W becomes small at portions where the light quantity is excessive. Accordingly, it is thought that when the fluctuation of the line width W in the exposure light quantity distribution at the time of exposure takes the distribution shown in FIG. 11, in the distribution of the exposure light quantity by main scanning at a time, the light quantity at a center portion as viewed in the width direction (x direction) is insufficient, and a light quantity at an edge portion becomes excessive.

Accordingly, when the line width W of the pixel electrodes 14 and the common electrodes 15 exhibits the distribution shown in FIG. 10 as a result of the exposure of the photosensitive material film using an exposure device which is calibrated such that the exposure exhibits the light quantity distribution shown in FIG. 9, it is considered sufficient to set the distribution of the exposure light quantity QoE such that, for example, as shown in FIG. 13, the light quantity at a center portion as viewed in the width direction (x direction) is large, and the light quantity at an edge portion as viewed in the width direction (x direction) is small. In FIG. 13, the distribution indicated by a dotted line is the distribution of the exposure light quantity QoE shown in FIG. 9. On the other hand, the distribution of the exposure light quantity QoE after correction indicated by a solid line in FIG. 13 is expressed as a relative value with respect to the exposure light quantity QoE before correction.

When a GLV is used as the spatial optical modulating element in the direct-writing-exposure-type exposure device, the distribution of the exposure light quantity QoE is determined based on intensity of diffraction light reflected on each ribbon-shaped light diffraction element. Since the intensity of the diffraction light deflected on the ribbon-shaped light diffraction element is changed in response to an electric signal (for example, magnitude of voltage) which is applied to move the ribbon-shaped light diffraction element, for example, it is sufficient to adjust the electric signal applied to each ribbon-shaped light diffraction element based on the fluctuation distribution of the line width W shown in FIG. 11.

Due to such adjustment, the light quantity at the center portion of the exposure in one main scanning is increased and the light quantity at the edge portion of the exposure in one main scanning is reduced. Accordingly, the line width W of the pixel electrode 14 and the common electrode 15 formed at the center portion of the exposure in one main scanning becomes small, and the line width W of the pixel electrode 14 and the common electrode 15 formed at the edge portion in one main scanning becomes large. By setting the line width W of the pixel electrode 14 and the common electrode 15 in this manner, in the distribution of the line width W, a fluctuation quantity of the line width W at a cycle (4 mm cycle) synchronizing with the width BW of the strip-shaped area BA is reduced, so that it is possible to reduce the periodic irregularity in brightness.

FIG. 14 to FIG. 18 are schematic views for explaining one example of the distribution of line width of the pixel electrodes and counter electrodes obtained when the exposure light quantity is corrected based on the principle of this embodiment, and a exposure light quantity correction method.

Figure 14:
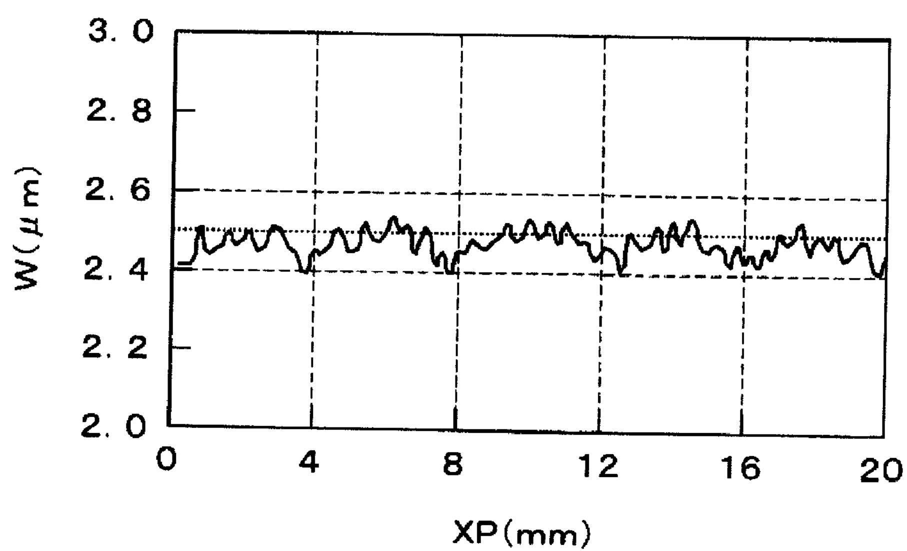
FIG. 14 is a schematic graph showing one example of the distribution of line width of the pixel electrode and the common electrode obtained when an exposure light quantity is corrected based on the principle of the embodiment.
Figure 15:
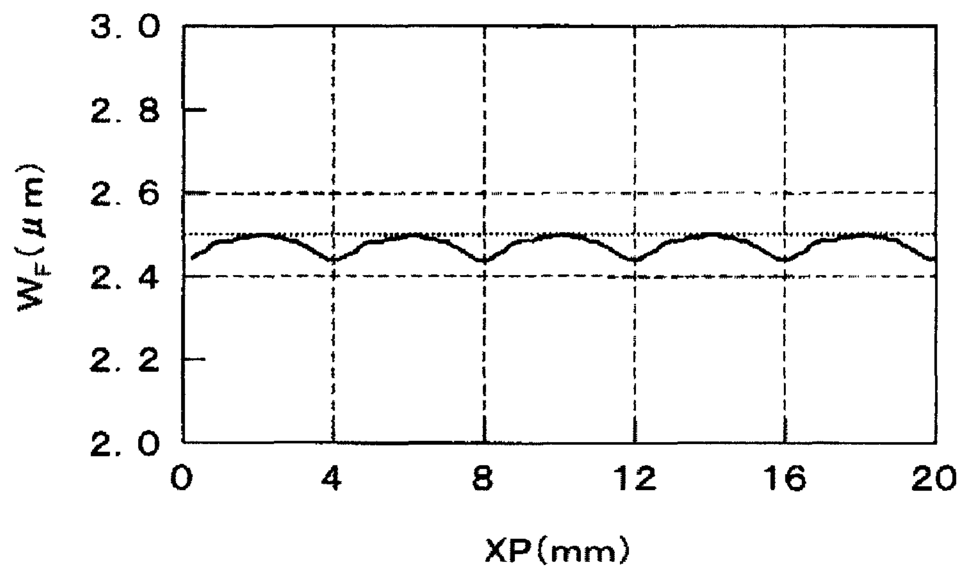
FIG. 15 is a schematic graph showing one example of a result obtained by removing noise components in the distribution of line width shown in FIG. 10.
Figure 16:
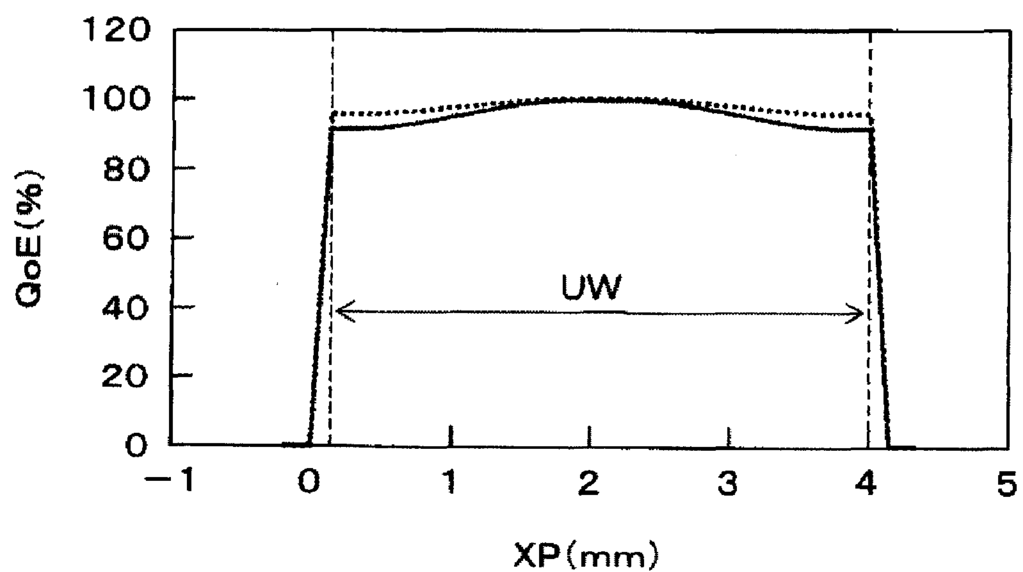
FIG. 16 is a schematic graph showing one example of a method of correcting a light quantity.
Figure 17:
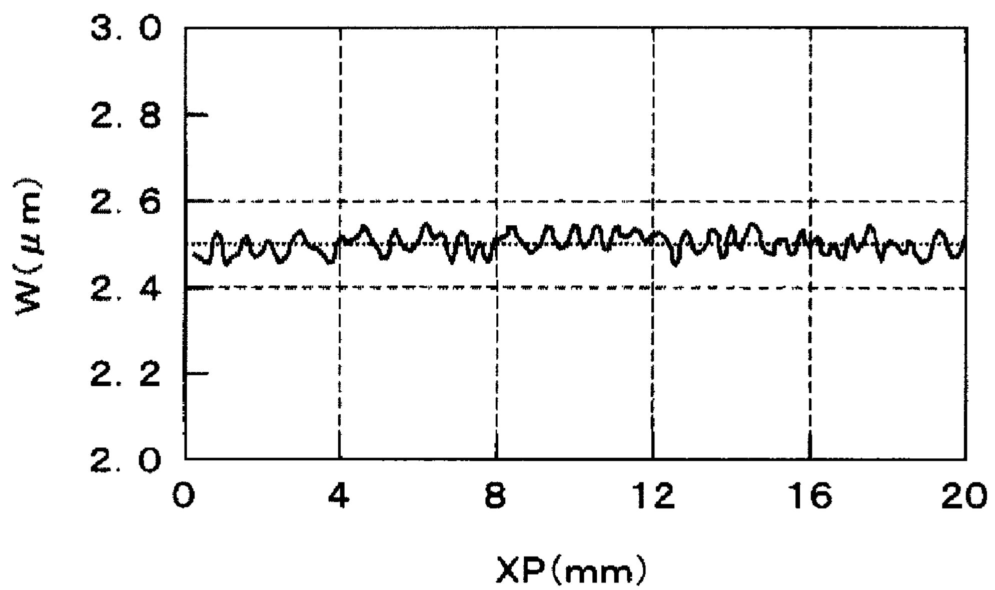
FIG. 17 is a schematic graph showing one example of the distribution of line width of the pixel electrode and the common electrode obtained when an exposure light quantity is corrected to the distribution shown in FIG. 16.
Figure 18:
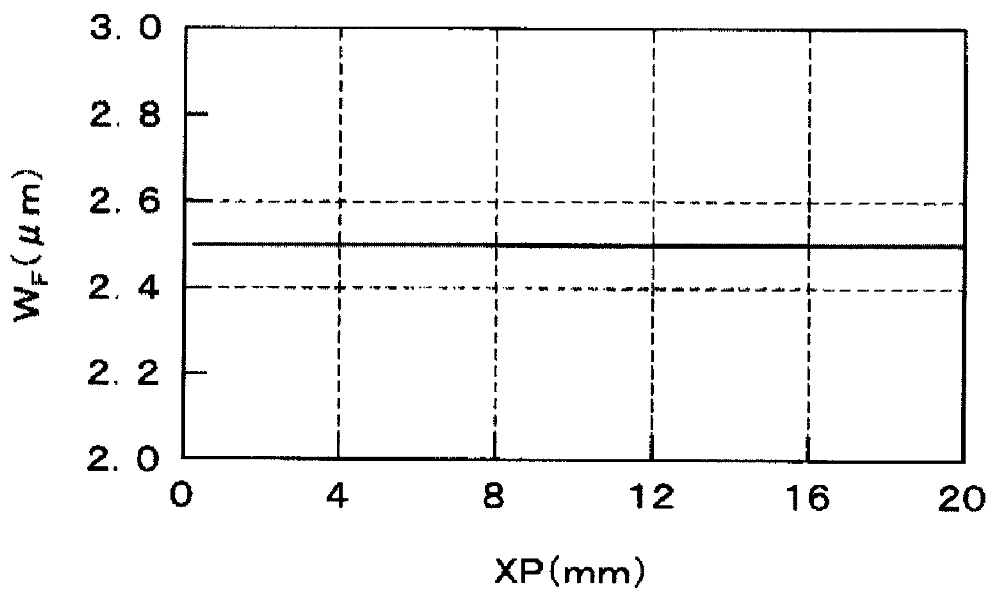
FIG. 18 is a schematic graph showing one example of a result obtained by removing noise components in the distribution of line width shown in FIG. 17.

FIG. 14 is a schematic graph showing one example of the distribution of line width of the pixel electrode and the common electrode obtained when the exposure light quantity is corrected based on the principle of the embodiment. FIG. 15 is a schematic graph showing one example of a result obtained by removing noise components in the distribution of line width shown in FIG. 10. FIG. 16 is a schematic graph showing one example of a light quantity correcting method. FIG. 17 is a schematic graph showing one example of the distribution of line width of the pixel electrode and the common electrode obtained when an exposure light quantity is corrected to the distribution shown in FIG. 16. FIG. 18 is a schematic graph showing one example of a result obtained by removing noise components in the distribution of line width shown in FIG. 17.

When inventors of the invention exposed the photosensitive material film using the exposure device in which the distribution of the exposure light quantity Qo was is corrected by the above-mentioned method, and the pixel electrodes 14 and the common electrodes 15 were formed, the distribution of the line width W of the pixel electrode 14 and the common electrode 15 in the respective pixels arranged in the x direction assumed the distribution shown in FIG. 14, for example. The fluctuation quantity of the line width W in the distribution shown in FIG. 14 is smaller than the fluctuation quantity in the distribution shown in FIG. 10. Accordingly, the liquid crystal display device manufactured in the above-mentioned manner can reduce irregularity in brightness caused by irregularity in line width W due to the relationship between the line width W and the relative brightness QoE shown in FIG. 5.

However, when noise components were eliminated by executing Fourier analysis of the distribution shown in FIG. 14, for example, waves having a cycle (4 mm cycle) synchronizing with the width BW of the strip-shaped area BA as shown in FIG. 15 were confirmed, and a fluctuation quantity of the waves was approximately 0.06 μm.

Even after correcting the distribution of the exposure light quantity QoE by the above-mentioned method, there may be a case where the line width W of the pixel electrode 14 and the common electrode 15 exhibits the distribution having such periodicity. In such a case, the distribution of the exposure light quantity QoE may be corrected again based on the distribution shown in FIG. 15. When the distribution of the line width W after removing noises assumes the distribution shown in FIG. 15, it is thought that although with respect to the distribution of the exposure light quantity QoE in main scanning at a time, the light quantity at the center portion as viewed in the width direction (x direction) is substantially appropriate, the light quantity at the edge portion as viewed in the width direction (x direction) is excessive.

Accordingly, when the line width W of the pixel electrodes 14 and the common electrodes 15 assume the distribution shown in FIG. 14, it is considered desirable to set the distribution of the exposure light quantity QoE such that, for example, as shown in FIG. 16, the light quantity at the center portion as viewed in the width direction (x direction) is maintained as it is, and the light quantity at the edge portion is further reduced. As shown in FIG. 16, the distribution indicated by a dotted line is the distribution of the exposure light quantity QoE after the first correction indicated by a solid line in FIG. 13.

When inventors of the invention exposed the photosensitive material film using the exposure device in which the distribution of the exposure light quantity QoE was corrected to the distribution shown in FIG. 16, and the pixel electrodes 14 and the common electrodes 15 were formed, the distribution of the line width W of the pixel electrode 14 and the common electrode 15 in the respective pixels arranged in the x direction assumed the distribution shown in FIG. 17, for example. Further, when noise components were eliminated by executing Fourier analysis of the distribution shown in FIG. 17, for example, a result shown in FIG. 18 was obtained. Periodicity (periodicity of 4 mm) synchronizing with the width BW of the strip-shaped area was not confirmed. Accordingly, the fluctuation of the line width W of the pixel electrode 14 and the common electrode 15 in the liquid crystal display panel obtained by the embodiment is constituted of only the fluctuation attributed to the noise components ΔW shown in FIG. 12 and hence, the fluctuation quantity of the line width W can be suppressed to approximately 0.1 μm.

In this manner, according to the method for manufacturing a liquid crystal display device of this embodiment, by correcting the distribution of the exposure light quantity QoE in the direct-writing-exposure-type exposure device based on the distribution of the line width W of the pixel electrode 14 and the common electrode 15 formed by the method, the fluctuation quantity of the line width W of the pixel electrode 14 and the common electrode 15 can be suppressed and, at the same time, the periodicity synchronizing with the width BW of the strip-shaped area BA can be eliminated. Accordingly, the liquid crystal display device obtained by the manufacturing method according to this embodiment can reduce local irregularity in brightness, and irregularity in brightness having periodicity synchronizing with the width BW of the strip-shaped area BA.

Figure 19:
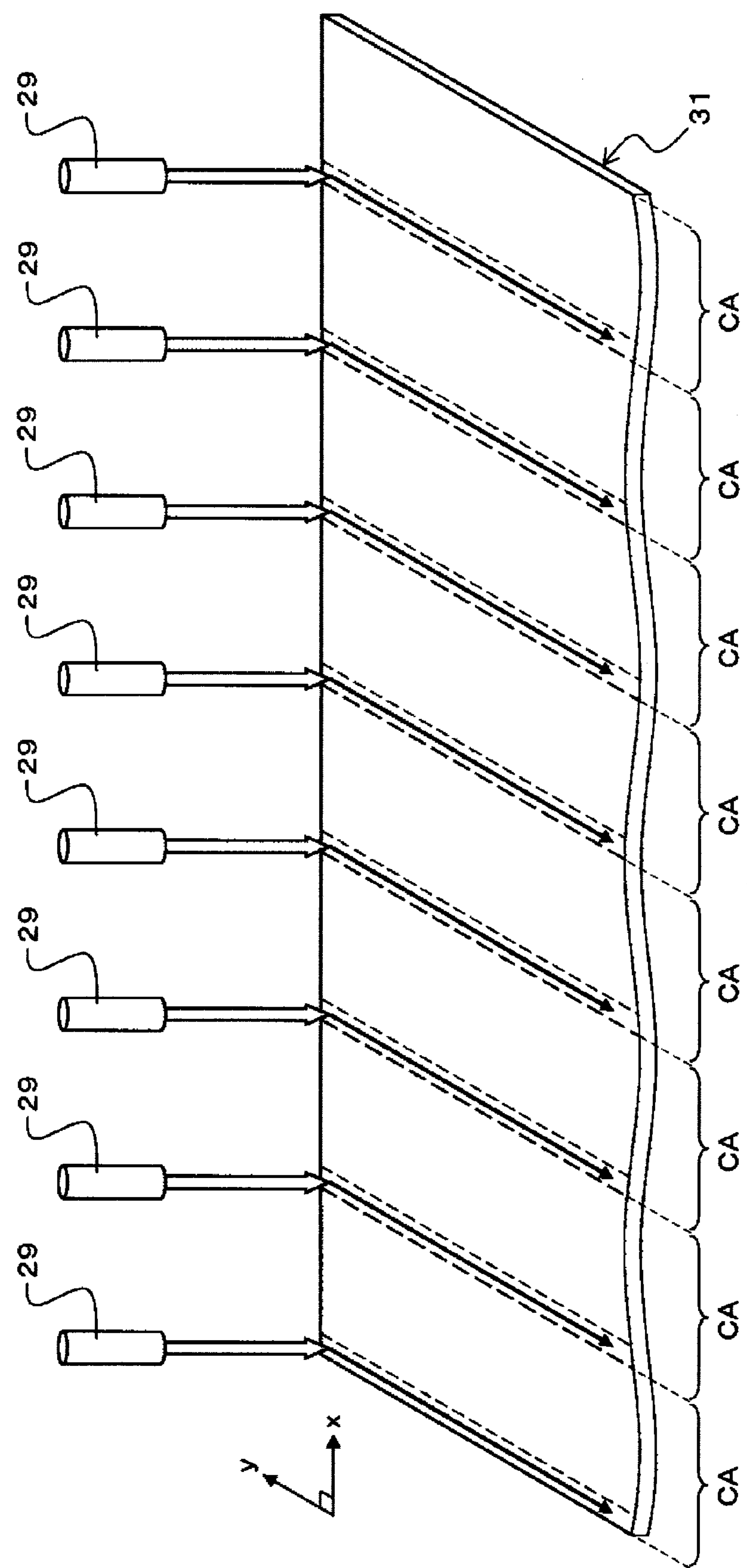
FIG. 19 is a schematic perspective view showing one specific example of an exposure method used in a method for manufacturing a liquid crystal display panel of this embodiment.

FIG. 19 is a schematic perspective view showing one specific example of an exposure method used in the method for manufacturing a liquid crystal display panel according to this embodiment.

In the manufacture of the liquid crystal display panel, as described previously, the liquid crystal display panel is generally manufactured using mother glasses having a large area. Here, assume that the size of the mother glass to be used is 730 mm×920 mm, for example, in exposing the photosensitive material film by the direct-writing-exposure-type exposure device, for example, the photosensitive material film is divided into strip-shaped areas BA having a size of 4 mm×920 mm. In this case, to expose the whole photosensitive material film, for example, it is necessary to perform main scanning at least 183 times. Accordingly, when the number of sets of optical units mounted on the exposure device is one, the exposure of the whole photosensitive material film takes extremely long time.

Accordingly, in the method for manufacturing a liquid crystal display panel (TFT substrate 1), when the photosensitive material film is exposed by the direct-writing-exposure-type exposure device, for example, as shown in FIG. 19, the photosensitive material film (exposure object area) formed on the base plate 31 is divided into eight areas CA, and the exposure of the eight areas CA is performed in parallel using eight sets of optical units (only a projection optical system of the optical unit shown in FIG. 19). Due to such exposure, compared to the exposure performed using only one set of optical unit, time necessary for the exposure of the whole photosensitive material film is reduced to ⅛, so that lowering of manufacturing efficiency of the TFT substrate 1 can be suppressed.

Here, eight sets of optical units have the spatial optical modulating elements (GLV) which are independent from each other, and the property (propensity) of the light quantity distribution usually differs for every optical unit. Accordingly, by calibrating the distribution of light quantity in each optical unit to the distribution shown in FIG. 9, the distribution of the line width W of the pixel electrode 14 and the common electrode 15 assumes the distribution which differs for every optical unit used in the exposure. Accordingly, when miniaturized liquid crystal display panels are manufactured by the multiple-piece simultaneous manufacturing using mother glasses having a large area, for example, uniformity of image quality among a plurality of liquid crystal display panels obtained by cutting one set of mother glasses is lowered. Further, when a liquid crystal display panel having a large screen is manufactured, for example, the brightness differs between a center portion and an edge portion of the screen thus giving rise to irregularity in brightness.

To the contrary, according to the manufacturing method in this embodiment, by correcting the distribution of exposure light quantity in the direct-writing-exposure-type exposure device based on the distribution of the line width W of the pixel electrodes 14 and the formed common electrodes 15 formed by the method, it is possible to suppress a fluctuation quantity of the line width W of the pixel electrode 14 and the common electrode 15 and, at the same time, it is possible to eliminate the periodicity of the fluctuation. In this manner, by correcting the light quantity distribution for every optical unit in accordance with the above-mentioned steps, it is possible to suppress irregularities in the line width W of the pixel electrode 14 and the common electrode 15 attributed to irregularity in light quantity distribution among the optical units. Accordingly, in the manufacture of miniaturized liquid crystal display panels by the multiple-piece simultaneous manufacturing using mother glasses having a large area, for example, it is possible to enhance uniformity of image quality among the plurality of liquid crystal display panels obtained by cutting one set of mother glasses. Further, in the manufacture of a liquid crystal display panel having a large screen, for example, the difference in brightness between a center portion and an edge portion of the screen can be reduced thus reducing irregularity in brightness.

As has been explained heretofore, according to the method for manufacturing a liquid crystal display panel of this embodiment, it is possible to reduce the local irregularity in brightness and the periodic irregularity in brightness.

This embodiment has been explained by mainly taking the case where the width BW of the strip-shaped area BA is set to 4 mm as an example. However, the manufacturing method according to this embodiment is not limited to such a case, and the width BW can also be changed within a range of approximately 1 mm to 10 mm, for example.

Further, this embodiment has been explained by taking the case where the pixel electrode 14 and the common electrode 15 are arranged on (the same plane of) the second insulation film 13 as shown in FIG. 2 to FIG. 4 as the example, for example. However, the manufacturing method according to this embodiment is not limited to such a case, and is also applicable to a case where the pixel electrode 14 and the common electrode 15 are stacked by way of an insulation layer. When the pixel electrode 14 and the common electrode 15 are stacked by way of the insulation layer, a planar shape of the electrode arranged closer to the liquid crystal layer 8 is usually formed into a comb-like shape. Accordingly, by performing the exposure of the photosensitive material film which is performed at the time of forming the electrode arranged closer to the liquid crystal layer 8 in accordance with the above-mentioned steps using the exposure device with the corrected exposure light quantity, it is possible to reduce irregularity in brightness attributed to irregularity in width of comb-teeth portions.

While there have been described what are at present considered to be certain embodiments of the invention, it will be understood that various modifications may be made thereto, and it is intended that the appended claims cover all such modifications as fall within the true spirit and scope of the invention.

For example, this embodiment has been explained by taking the exposure of the photosensitive material film which is performed in the step of forming the pixel electrodes 14 and the common electrodes 15 as an example. However, it is needless to say that the invention is not limited to such a case, and is also applicable to the exposure of the photosensitive material film which is performed in another step. Further, it is needless to say that the invention is not limited to the exposure of the photosensitive material film which is performed in the manufacture of the TFT substrate 1, and is also applicable to the exposure of the photosensitive material film which is performed in the manufacture of the counter substrate 2, for example.

Further, it is needless to say that the invention is not limited to the method for manufacturing the IPS-type liquid crystal display panel exemplified in the above-mentioned embodiment and is also applicable to a method for manufacturing a VA-type or TN-type liquid crystal display panel.

Still further, it is needless to say that the invention is not limited to the method for manufacturing the liquid crystal display panel, and is also applicable to a method for manufacturing a self-luminous-type display panel which uses organic EL elements, for example.

What is claimed is:

1. A method for manufacturing a display device comprising the step of forming a preset basic pattern in a plurality of places on an insulation substrate by exposing and developing a photosensitive material film which is formed on the insulation substrate, wherein the exposure of the photosensitive material film is performed using a direct writing exposure device in such a manner that an exposure object area is divided into a plurality of small areas, the whole exposure object area is exposed by performing the exposure for every small area, and a pattern of light to be radiated to each small area is formed by performing a numerical control of a spatial optical modulating element, wherein the exposure of the photosensitive material film is performed using the direct writing exposure device in which the light quantity distribution of the pattern of light formed by the spatial optical modulating element is corrected such that a fluctuation quantity of a size of the basic pattern formed in the plurality of places becomes not more than 0.2 μm.

2. The method for manufacturing a display device according to claim 1, wherein the exposure of the photosensitive material film is performed using the direct writing exposure device in which the light quantity distribution of the pattern of light formed by the spatial optical modulating element is corrected such that the fluctuation quantity of a size of the basic pattern formed in the plurality of places becomes not more than 0.1 μm.

3. The method for manufacturing a display device according to claim 1, wherein Fourier analysis is executed on the fluctuation distribution of the size of the basic pattern formed in the plurality of places, and the correction of the light quantity distribution is performed based on the difference between a preset size of the basic pattern and a size of the basic pattern obtained by the Fourier analysis.

4. The method for manufacturing a display device according to claim 3, wherein the photosensitive material film is of a positive type, and the light quantity distribution is corrected such that the light quantity is increased when the size of the basic pattern obtained by the Fourier analysis is larger than the preset size, and the light quantity is reduced when the size of the basic pattern obtained by the Fourier analysis is smaller than the preset size.

5. The method for manufacturing a display device according to claim 1, wherein the basic pattern is formed on a transparent conductive film, and the transparent conductive film is etched using the basic pattern as a mask after the formation of the basic pattern thus forming a first electrode and a second electrode.

6. The method for manufacturing a display device according to claim 5, wherein the first electrode and the second electrode are formed such that the first electrode and the second electrode have a planar comb-like shape respectively, and a comb-teeth portion of the first electrode and a comb-teeth portion of the second electrode are alternately arranged.

7. The method for manufacturing a display device according to claim 5, wherein Fourier analysis is executed on the fluctuation distribution of a size of the first electrode and a size of the second electrode formed in the plurality of places, and the correction of the light quantity distribution is performed based on the difference between preset sizes of the first electrode and the second electrode and sizes of the first electrode and the second electrode obtained by the Fourier analysis.

8. The method for manufacturing a display device according to claim 1, wherein the basic pattern is formed on the transparent conductive film, and the transparent conductive film is etched using the basic pattern as a mask after the formation of the basic pattern thus forming electrodes having a planar comb-like shape.

9. The method for manufacturing a display device according to claim 8, wherein Fourier analysis is executed on the fluctuation distribution of the size of the electrodes formed in the plurality of places, and the correction of the light quantity distribution is performed based on the difference between a preset size of the electrodes and a size of the electrodes obtained by the Fourier analysis.

10. The method for manufacturing a display device according to claim 1, wherein the spatial optical modulating element is constituted of a plurality of ribbon-shaped light diffraction elements, and the plurality of ribbon-shaped light diffraction elements are movable independently from each other, and intensity of diffraction light is changed correspondingly to a moving quantity of each ribbon-shaped light diffraction element.

11. A liquid crystal display device comprising:

a display area in which pixels each having a TFT element, a pixel electrode, a common electrode and a liquid crystal layer are arranged in a matrix array, wherein the plurality of pixel electrodes which are arranged in the display area in a matrix array are formed such that, with respect to a size of the pixel electrode in a direction as viewed in a plan view, the difference between the size of the pixel electrode which assumes a maximum value and the size of the pixel electrode which assumes a minimum value is set to not more than 0.2 μm.

12. The liquid crystal display device according to claim 11, wherein the plurality of pixel electrodes are formed such that, with respect to the size of the pixel electrode in the direction as viewed in a plan view, the difference between the size of the pixel electrode which assumes the maximum value and the size of the pixel electrode which assumes the minimum value is set to not more than 0.1 μm.

13. The liquid crystal display device according to claim 1, wherein the pixel electrode has a comb-like shape comprising a plurality of strip-shaped portions as viewed in a plan view, and the difference between a maximum value and a minimum value of a width of the strip-shaped portion and the difference between a maximum value and a minimum value of a gap defined between two neighboring strip-shaped portions are set to not more than 0.2 μm.

* * * * *